United States Patent [19]

Lage et al.

[11] Patent Number: 5,079,177
[45] Date of Patent: Jan. 7, 1992

[54] PROCESS FOR FABRICATING HIGH PERFORMANCE BICMOS CIRCUITS

[75] Inventors: Craig S. Lage; James E. Small, both of Puyallup, Wash.; Bamdad Bastani, Danville, Calif.

[73] Assignee: National Semiconductor Corporation, Santa Clara, Calif.

[21] Appl. No.: 409,545

[22] Filed: Sep. 19, 1989

[51] Int. Cl.$^5$ ............................................ H01L 21/265
[52] U.S. Cl. .................................. 437/31; 437/56; 437/59; 437/162; 148/DIG. 9
[58] Field of Search .................. 437/56, 57, 31, 34, 437/55, 59, 152, 153, 154, 162; 148/DIG. 9, DIG. 82, DIG. 151

[56] References Cited

U.S. PATENT DOCUMENTS

| 4,764,482 | 8/1988 | Hsu ............................. 437/31 |
| 4,797,372 | 1/1989 | Verret et al. ................. 437/31 |

FOREIGN PATENT DOCUMENTS

| 0150349 | 6/1989 | Japan ........................... 437/59 |

OTHER PUBLICATIONS

Bastani et al., "Advanced One Micron BiCMOS Technology for High Speed 256K SRAM", 1987 *VLSI Technology Symposium*, Karuizawa, May 18-21, 1987.

Watanabe et al., "High Speed BiCMOS VLSI Technology with Buried Twin Well Structure", *IEDM Technical Digest*, Washington, D.C., Dec. 1-4, 1985, pp. 423-426.

*Primary Examiner*—Brian E. Hearn
*Assistant Examiner*—Tuan Nguyen
*Attorney, Agent, or Firm*—Townsend and Townsend

[57] ABSTRACT

A method of making complementary vertical bipolar transistors and complementary field effect transistors on the same substrate is described. The process includes forming buried layers in a semiconductor substrate which are spaced apart in a self-aligned manner by use of a lateral etching technique to undercut the mask used for definition of the buried layers. In the process, the collector and base contacts of the bipolar devices and the corresponding conductivity-type sources and drains of the field effect transistors are combined to minimize processing steps. The process also includes a silicided polycrystalline silicon layer used to form resistors and contact the various transistors.

13 Claims, 7 Drawing Sheets

PROCESS FOR FABRICATING HIGH PERFORMANCE BICMOS CIRCUITS

BACKGROUND OF THE INVENTION

1. Field of the Invention

This invention relates to processes for manufacturing integrated circuits, and in particular, to a process for fabricating integrated circuits having both bipolar and complementary field effect transistors on a common substrate. The process is particularly suited to the manufacture of high performance products, for example, high speed static random access memories.

2. Description of the Prior Art

Numerous processes are now well known for the manufacture of BiCMOS integrated circuits. See, for example, Bastani, et al., "Advanced One Micron BiCMOS Technology for High Speed 256k SRAMs," 1987 VLSI Symposium; Watanabe, et al., "High Speed BiCMOS VLSI Technology with Buried Twin Well Structure," 1985 IEDM. Such processes typically have not been optimized for the manufacture of either the bipolar or the field effect portions of the circuit. For example, in such prior art processes, there is typically a large encroachment by the field oxide used to electrically isolate individual devices from each other. The large field oxide encroachment is undesirable because it decreases device density and degrades performance of the completed circuit. In addition, lower density means that a larger chip size is required for the fabrication of a fixed number of transistors. The larger chip size reduces the yield and therefore increases the cost of the completed product.

Another problem with prior art BiCMOS processes is that the small geometry MOS transistors have been prone to punchthrough, due to the use of relatively thick gate oxides and relatively deep source/drain junctions. In addition, the bipolar devices typically have a high collector-substrate capacitance and a high parasitic capacitance. This undesirably slows circuit operation.

Another disadvantage of prior art BiCMOS processes has been that metal contacts to shallow junctions have been susceptible to leakage. In addition, such prior art BiCMOS processes formed high resistance polysilicon load resistors using techniques which required relatively long resistors, thereby limiting the density of memory cells formed using the BiCMOS process.

Another difficulty with prior art BiCMOS processes was the requirement for tapered sidewalls in contact openings to obtain adequate metal step coverage. The tapered sidewalls undesirably expand the surface area required for a contact, thereby limiting layout density. The reduced layout density carries with it the difficulties mentioned above.

A further disadvantage is the use in prior art BiCMOS processes of relatively long thermal processes. These processes create deep junctions which are incompatible with scaled devices.

SUMMARY OF THE INVENTION

Particular embodiments of the process of our invention overcome various of the foregoing difficulties. In an embodiment our process increases density and performance over prior art BiCMOS processes. In our BiCMOS process, the electrically isolating field oxide is formed using a zero encroachment technique, yet one which results in a substantially planar field oxide, thereby increasing device density. The collector-substrate capacitance in the bipolar devices is reduced by reducing the collector area and by separating the N-and P-conductivity type buried layers using a self-aligned technique. Furthermore, small geometry MOS transistors resistant to punchthrough are fabricated using shallower junctions, thinner gate oxide, and more heavily doped well profiles. The parasitic regions in bipolar devices are reduced through the use of a self-aligned polysilicon base and emitter contact and recessed oxide isolation. Self-aligned polycrystalline silicon contacts are also employed in the MOS transistors. Metal contacts to shallow junctions are eliminated by the use of an intermediate polycrystalline silicon layer.

A particular advantage of one embodiment of the process of our invention enables the fabrication of short polycrystalline silicon load resistors by the use of a metal silicide contact. Also, the need for sloped contact openings to achieve adequate metal step coverage is eliminated by employing tungsten plugs deposited using chemical vapor deposition.

In a preferred embodiment, the process of our invention comprises a method of fabricating complementary conductivity-type buried layers in a semiconductor substrate. The method includes the steps of defining a mask across the surface of the substrate to expose only regions of the substrate where a first conductivity-type impurity is desired. First conductivity-type impurity is introduced into the exposed regions of the substrate. Then portions of the mask laterally adjacent the periphery of the regions doped with the first conductivity-type impurity are removed to thereby expose additional regions of the substrate. Following this step a layer of masking material is formed over all of the exposed portions of the substrate, and then the original mask is removed. Finally, a second impurity of opposite conductivity-type to the first impurity is introduced into the substrate except where it is overlaid by the layer of masking material. The step of removing regions laterally adjacent the periphery allows the opposite conductivity-type buried layers to be spaced apart, yet self-aligned.

In another portion of the process of our invention a resistor is fabricated on an integrated circuit structure. In this aspect of the process, a layer of polycrystalline silicon is deposited across the surface of the structure and a layer of silicon dioxide formed over the polycrystalline silicon except where electrical contacts to the resistor are desired. Then, a silicide-forming metal is deposited on the polycrystalline silicon except where it is protected by the silicon dioxide. Finally, the silicide-forming metal is reacted with the polycrystalline silicon to form metal silicide. Of course, because silicide is used elsewhere on the circuit to perform other functions, such as local interconnection, the silicon dioxide silicide exclusion layer will be formed elsewhere as well.

In a further portion of the process of our invention a pair of complementary bipolar transistors and a pair of complementary field effect transistors are formed using common process steps. This process includes the steps of forming first and second buried layers in a semiconductor substrate, each of the buried layers adjacent an upper surface of the substrate, each being of a specified conductivity type. Then a layer of epitaxial silicon is deposited across the upper surface of the substrate over each of the buried layers. Later in the process, a layer of polycrystalline silicon is deposited on the epitaxial silicon to form a gate of a P-channel field effect transistor and a gate of an N-channel field effect transistor. Then, in a single step, the base region of the PNP bipolar device and the corresponding conductivity-type low doped drain and source regions of the N-channel field effect transistors are doped. Also in a single step, the collector contact of the NPN bipolar transistor and the corresponding conductivity-type source and drain of the N-channel field effect transistor are doped. Finally, in another single step, a base contact region of the NPN bipolar device, a collector contact of the PNP bipolar device, and the corresponding conductivity-type source and drain of the P-channel field effect transistor are doped.

A second layer of polycrystalline silicon is deposited across the upper surface of the transistors to form the emitter contacts of the bipolar transistors. Next, the emitter contacts are doped. Then, impurities from the respective emitter contacts of the bipolar transistors are diffused into the corresponding base regions of the bipolar transistors to form the respective emitter regions of the bipolar transistors.

DETAILED DESCRIPTION OF THE PREFERRED EMBODIMENTS

Figure 1:
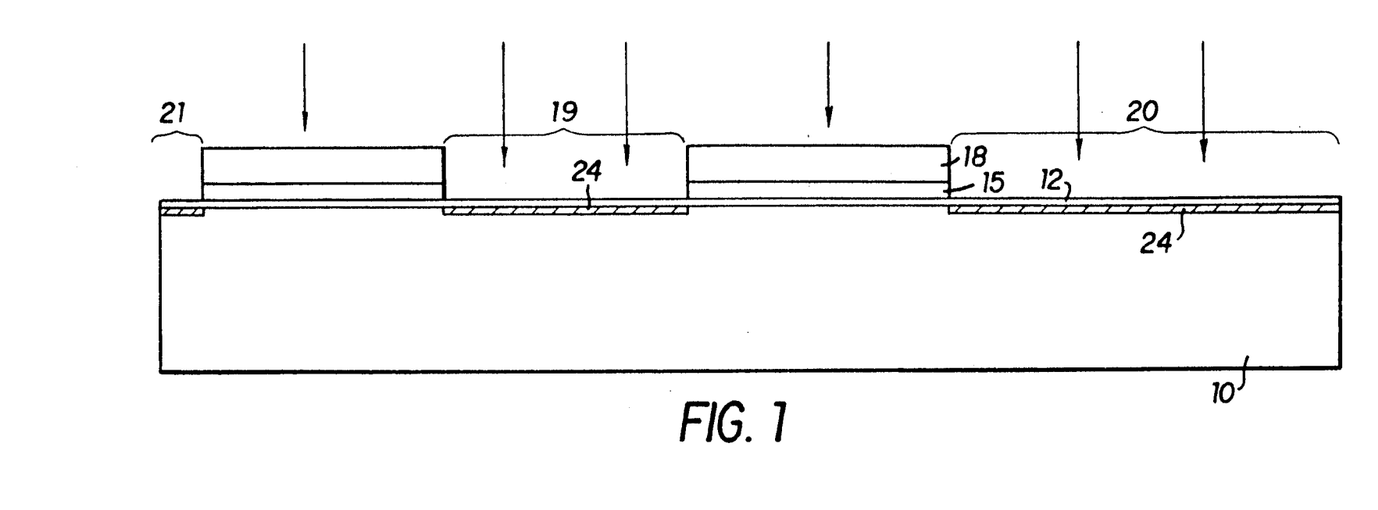
FIG. 1 is a cross-sectional view of a semiconductor structure after implantation of a P-type buried layer.

FIG. 1 is a cross-sectional view of a semiconductor structure which may be fabricated using well known process technology. The structure depicted in FIG. 1 serves as a starting point for a description of the process of our invention. As shown in FIG. 1, on a lightly-doped, P-conductivity type silicon substrate, having 30-50 ohm-centimeter resistivity, a thin layer of stress relief oxide 12 is formed. Silicon dioxide layer 12 typically is about 225 Angstroms thick and functions in a well known manner to alleviate thermal stresses induced by expansion or contraction of overlying layers. On the upper surface of oxide 12, a layer of silicon nitride 15 approximately 1500 Angstroms thick is deposited using chemical vapor deposition. Finally, as shown in FIG. 1, on the upper surface of silicon nitride 15 a layer of photoresist 18 is formed. Photoresist 18 is well known photoresist conventionally available from many suppliers. Using well known masking techniques, photoresist 18 is exposed and developed to remove it from regions where a P-type buried layer is desired, e.g., regions 19, 20 and 21. After photoresist 18 is removed, silicon nitride layer 15 is etched using well known wet or dry processes. To protect the substrate, an etchant is employed which does not attack the silicon dioxide layer 12.

Finally, as also shown in FIG. 1, a P-conductivity type implant is performed to introduce P-type impurities into regions of the substrate 10 where P-conductivity type buried layers are desired. Three such regions 19, 20, and 21 are depicted in FIG. 1, although only small portions of regions 20 and 21 are shown. In the preferred embodiment a 8.0 E 13 atoms/cm$^2$ dose of boron impurity is employed with 90 kev energy level to form buried layer implant 24.

Figure 2:
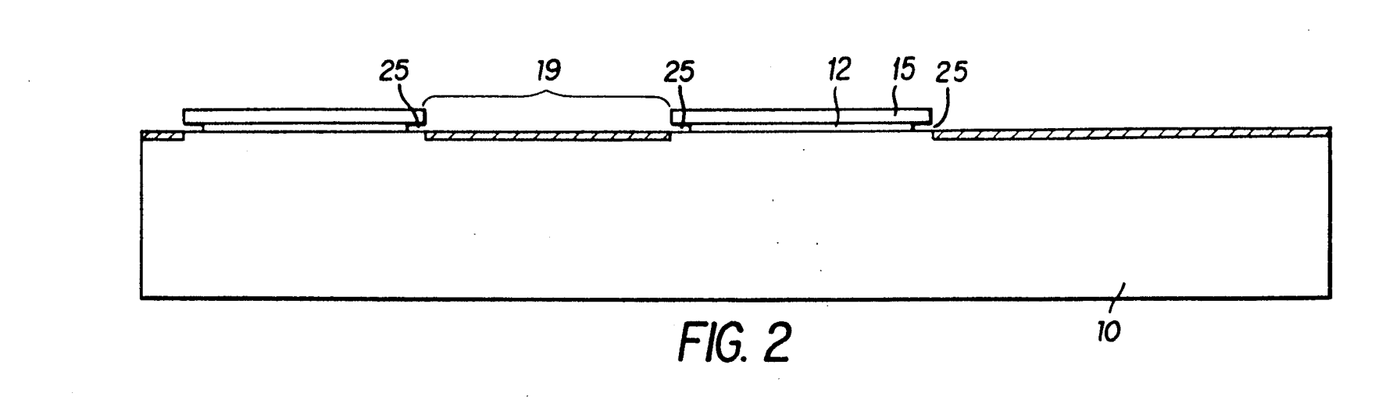
FIG. 2 is a cross-sectional view of a semiconductor structure after isotropic etching of a silicon dioxide layer beneath a silicon nitride layer.

As next shown in FIG. 2, the photoresist is removed from the structure, and the silicon dioxide layer 12 is etched using a well known acid. The etchant will completely remove the silicon dioxide layer in those regions not protected by silicon nitride layer 15. In addition, because of its isotropic properties, the acid will etch some of the silicon dioxide from beneath the edges of the silicon nitride layer 15. The result is to create small regions 25 where the silicon nitride 15 overhangs the silicon dioxide 13. In the preferred embodiment an overhang of 1.25 microns is desired.

Figure 3:
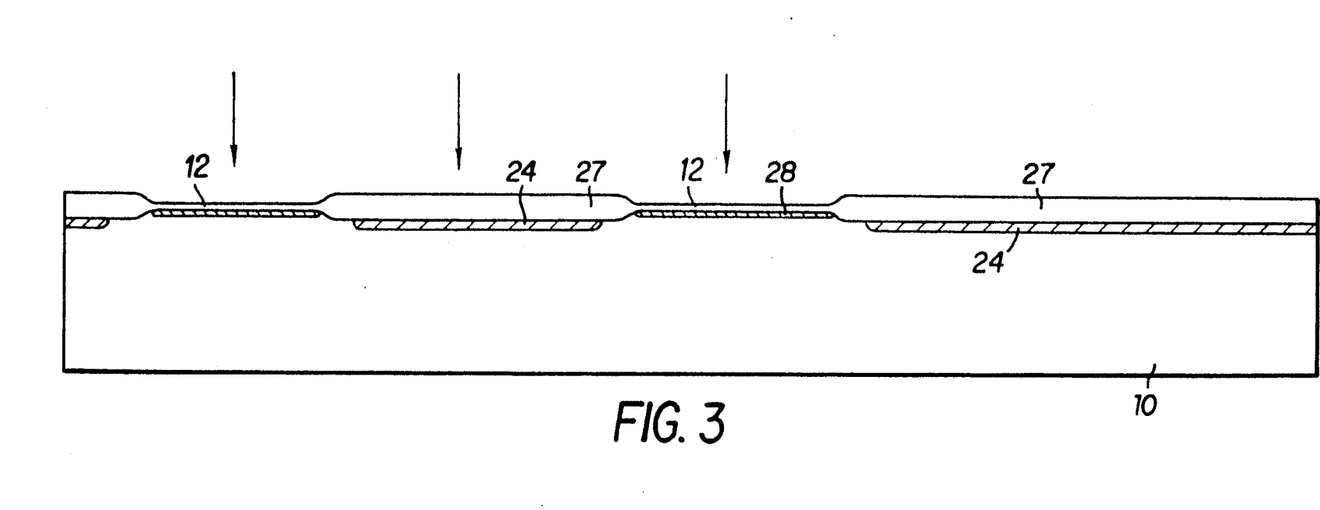
FIG. 3 is a cross-sectional view of a semiconductor structure after annealing of the buried layers.

FIG. 3 depicts the next several steps of the process. As shown there, the semiconductor structure is oxidized to create a relatively thicker layer of buried layer masking oxide 27 between regions of the substrate protected by silicon nitride. Of course, silicon dioxide 12 remains beneath these nitride regions during this portion of the process. In the preferred embodiment, a buried layer masking oxide is approximately 5000 Angstroms thick and is formed by heating the structure in an oxidizing ambient to a temperature of 950° C. for 3 hours. It should be appreciated, however, that this thickness is somewhat arbitrary, and that the buried layer oxide need only be thick enough to resist an N-conductivity type implantation step described below. In other words, if lower energy implantation is employed, then thinner oxide layers may be formed, while if higher energy implantation is used, then thicker oxide layers will be required.

Following formation of the buried layer masking oxide 27, the silicon nitride is removed from the surface of the structure and another implantation step performed. During this implantation step, N-conductivity type impurity, preferably arsenic, is introduced into the structure to form N-type regions beneath the regions previously protected by silicon nitride. The arsenic is ion-implanted with a dose of 6.0 E 15 atoms/cm$^2$ at 75 kev. Importantly, because of the encroachment of the buried layer masking oxide 27 beneath the protective nitride, the thick masking oxide 27 extends slightly beyond the perimeter of the P-type buried layer implant 24. This spacing results in the P-conductivity type wells being separated from the N-conductivity type wells in the final product. The separation of the wells can be controlled by controlling the amount that the silicon nitride overhangs the silicon dioxide in FIG. 2.

Figure 4:
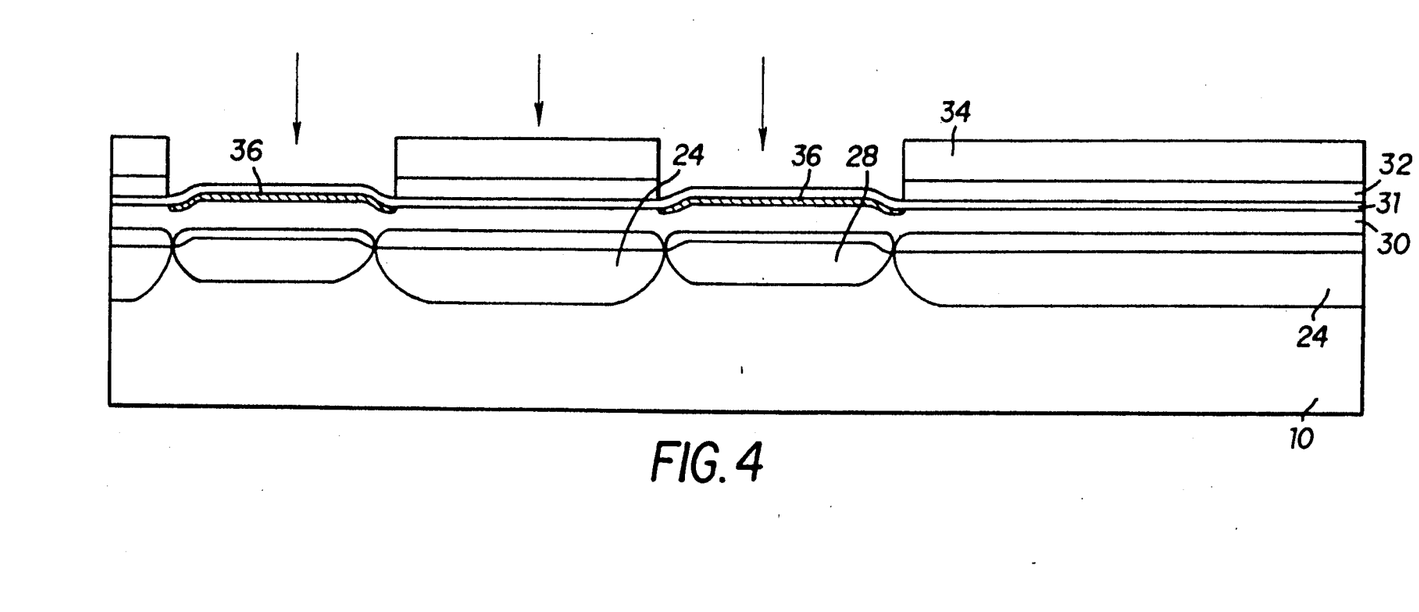
FIG. 4 is a cross-sectional view of a semiconductor structure after ion-implantation of the N-type wells in the epitaxial layer.

The next several steps of the process are described in conjunction with FIG. 4. After implanting the N-type impurity, the buried layers are annealed by heating the structure for a prolonged period. In the preferred embodiment, the structure is heated to a temperature of 1000° C. for 20 minutes in a nitrogen ambient. During the annealing process, the N- and P-type impurities in the substrate will diffuse downward and outward from their initially implanted locations to create buried layers having the general appearance depicted in FIG. 4. Next, the masking oxide 27, as well as the initially-formed stress relief oxide, are stripped from the surface of the structure using a well known acid.

Then, using well known semiconductor fabrication technology, a layer of epitaxial silicon 30 is deposited across the upper surface of the structure. Preferably, epitaxial layer 30 is deposited from dichlorosilane to a thickness of approximately 1.30 microns. Of course, thicker or thinner epitaxial layers may be employed depending upon the characteristics desired for the transistors which will ultimately be formed therein.

On the upper surface of epitaxial layer 30, another layer of stress relief oxide 31 is formed, using a thermal process like that described above. Similarly, another layer of silicon nitride 32 is deposited on the upper surface of oxide layer 31. Although not shown in FIG. 4, silicon nitride layer 32 initially extends across the entire upper surface of the wafer. Finally, on the upper surface of nitride 32 a layer of photoresist 34 is deposited.

Again, using well known photolithographic technology, openings are defined in photoresist layer 34 wherever the N-wells 28 are situated. These openings may be formed using a mask which is a negative of the mask used to define the P buried layers in FIG. 1, or using the same mask as in FIG. 1, but employing opposite type of photoresist. In a similar manner to that described above, the nitride unprotected by overlying photoresist 34 is removed, and another ion-implantation step performed. In this ion-implantation step an N-type impurity, preferably phosphorus, is implanted to form N-well implant regions 36 adjacent the upper surface of the epitaxial layer 30. Preferably, these regions are implanted using a dose of 6.0 E 12 atoms/cm$^2$ at 80 kev energy. The appearance of the structure after this implant is depicted in FIG. 4.

Following the N-well implant into the epitaxial layer 30, the structure is oxidized by heating it to a temperature of 950° C. for 3 hours in an oxidizing ambient. During this step the silicon dioxide layer 31 overlaid by nitride 32 is essentially unaffected. In contrast, the oxide not protected by nitride becomes much thicker, thereby forming well masking oxide regions 38, typically on the order of 5000 Angstroms thick.

Figure 5:
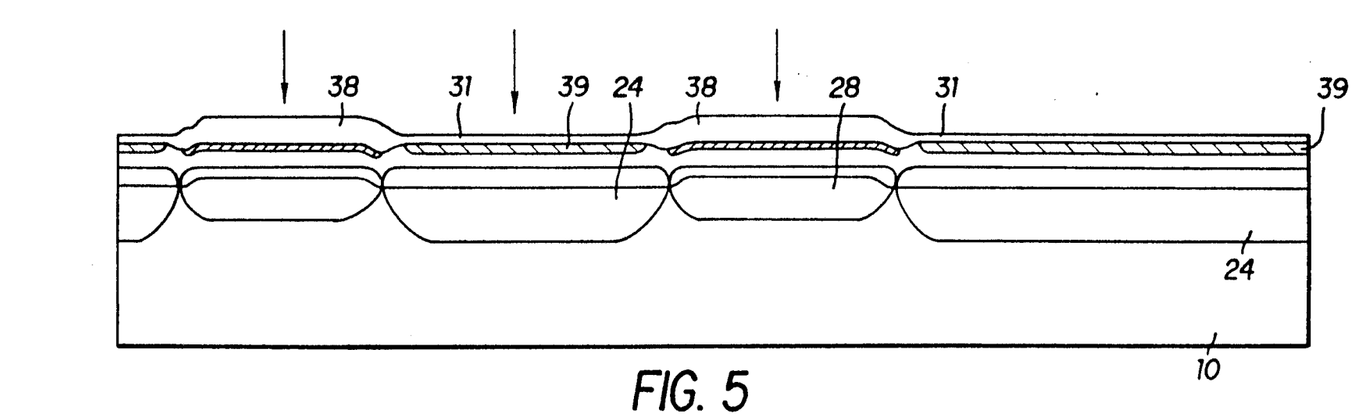
FIG. 5 is a cross-sectional view of a semiconductor structure after implantation of the P-type wells in the epitaxial layer.

Next, the remaining portions of silicon nitride layer 32 are removed from the structure, and a P-well implant performed. The P-well implant will create P-well implant regions 39 as shown in FIG. 5. Preferably, the P-well implant employs a dose 1.0 E 12 atoms/cm$^2$ of boron impurity at an energy of 50 kev. Following the P-well implant 39, the silicon dioxide is stripped from the upper surface of the structure using conventional etching technology. Then, another thin layer of silicon dioxide 40, approximately 250 Angstroms thick, is formed, preferably using thermal oxidation.

Figure 6:
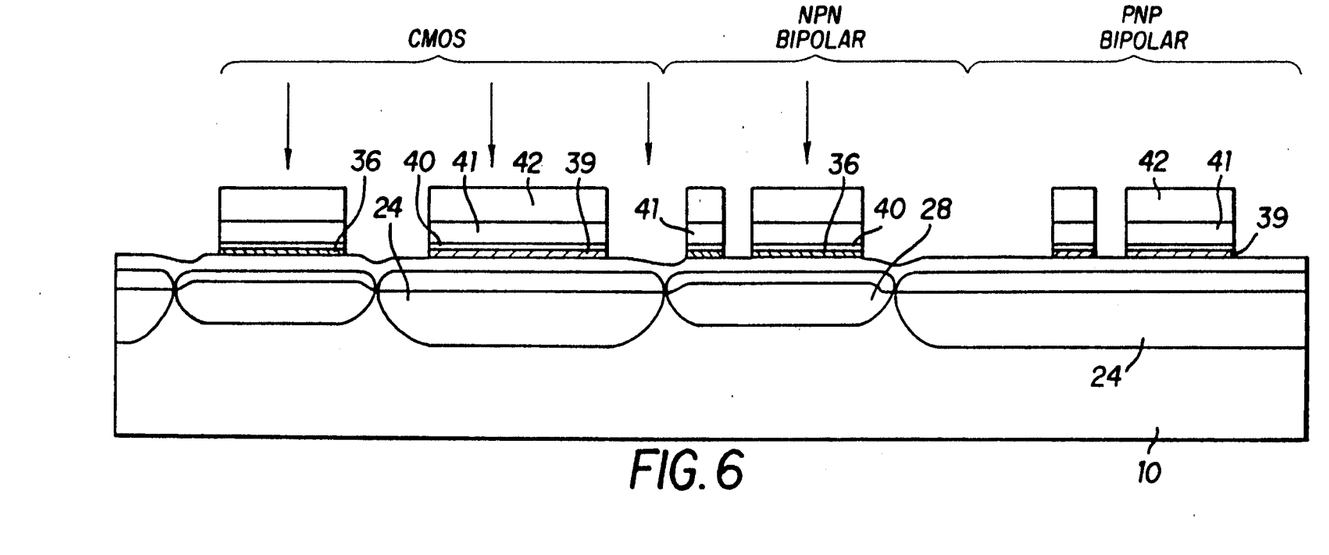
FIG. 6 is a cross-sectional view of a semiconductor structure after definition of the regions of the structure where field oxide is desired.

On the upper surface of oxide 40, another layer of silicon nitride 41 is deposited. Nitride layer 41 is approximately the same thickness as the nitride layers described above. Finally, a layer of photoresist 42 is formed on the upper surface of nitride 41. Photoresist 42 is masked and developed as shown in FIG. 6. At this stage of the process, the photoresist protects all of the active areas of the to-be-formed circuit. For illustration, CMOS devices ultimately will be formed in the left-hand portion of FIG. 6, while bipolar devices will be formed in the right-hand portion.

After definition of the photoresist, suitable etchants are employed to remove the exposed silicon nitride 41, silicon dioxide 40, and approximately the upper 3000 Angstroms of epitaxial layer 30. This process may be carried out using conventional wet or dry etching processes and the appropriate selective etchants. Because of the tolerances desired, in the preferred embodiment an anisotropic process is employed. Following the etching, if desired, the exposed portions of epitaxial silicon 30 may be implanted with a suitable impurity to prevent field inversion. Ultimately, this impurity will be disposed below the field oxide which isolates the bipolar devices from the CMOS devices, and each device from another. The appearance of the structure at this stage in the process, assuming no field implant, is depicted in FIG. 6.

Figure 7:
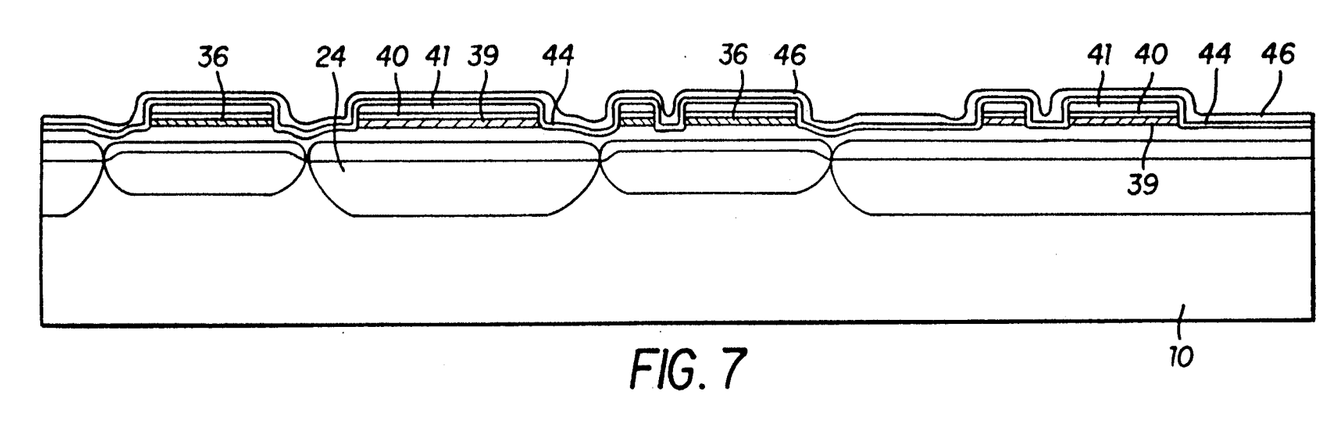
FIG. 7 is a cross-sectional view of a semiconductor structure after deposition of a layer of silicon dioxide.

Next, the photoresist layer 42 is removed, and a thin layer of stress relief oxide formed over all of the exposed regions of epitaxial layer 30. Because of its relative thinness, this layer of stress relief oxide is not shown in FIG. 7. Another layer of silicon nitride 44 then is deposited across the entire surface of the structure. Over the upper surface of silicon nitride 44, another layer of silicon dioxide 46 is formed; this time, however, preferably by chemical vapor deposition. In the preferred embodiment oxide layer 46 is approximately 1200 Angstroms thick.

Figure 8:
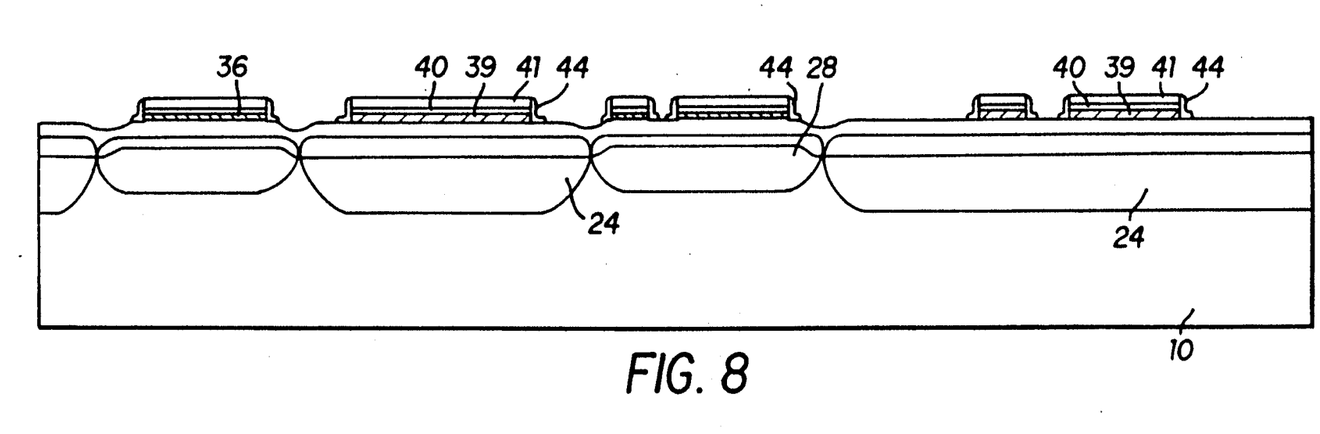
FIG. 8 is a cross-sectional view of a semiconductor structure after etching to remove the oxide portion of the spacer regions.

Following the formation of silicon dioxide layer 46, an anisotropic etch step is performed to etch through the silicon dioxide 46 and silicon nitride 44 (as well as the underlying stress relief oxide) until silicon from the epitaxial layer 30 is exposed. Because this process is essentially anisotropic, those regions of the structure where the oxide-nitride-oxide sandwich vertically traverses the edges of the underlying oxide 40-nitride 41 sandwich are not etched completely, thereby forming spacer regions. Next, the structure is subjected to a buffered oxide etchant. This removes the silicon dioxide from atop the spacer regions of silicon nitride 44. In other words, the spacer regions at this stage in the process consist only of silicon nitride, as shown in FIG. 8.

Figure 9:
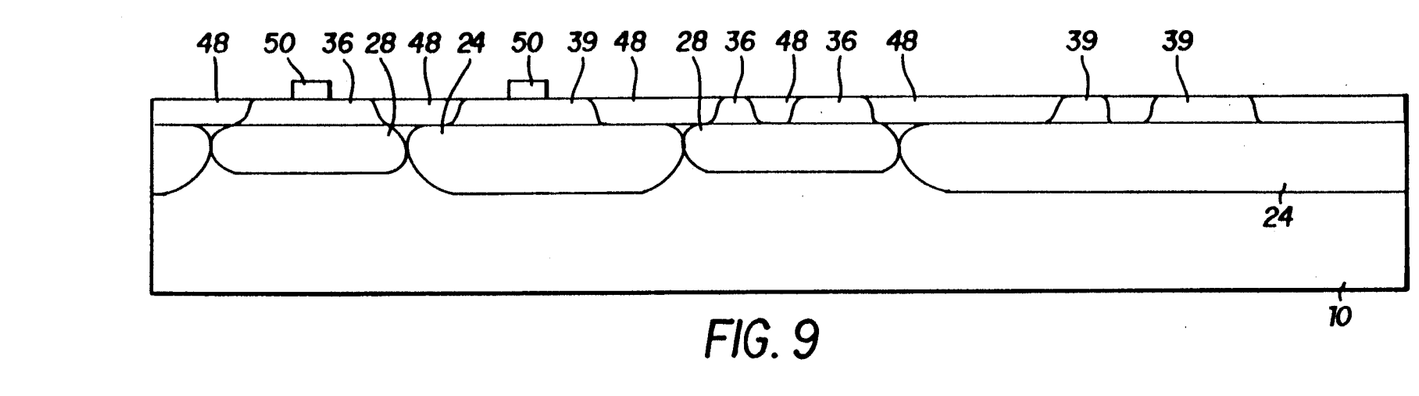
FIG. 9 is a cross-sectional view of a semiconductor structure after oxidation of the first layer of polycrystalline silicon.

The next several steps of the process are described in conjunction with FIG. 9. After removal of the spacer oxide, the entire structure is subjected to a field oxidation step by heating the structure in an oxidizing ambient at a pressure of 10 atmospheres to form relatively thick field oxide regions 48. In the preferred embodiment, the structure is heated to a temperature of 1000° C. for 15 minutes to form field oxide regions which are approximately 7500 Angstroms thick. These field oxide regions 48 extend through the epitaxial silicon to the underlying P- and N-conductivity type buried layers, 24 and 28, respectively. During this step, the P- and N-conductivity type well regions, 39 and 36, respectively, in the epitaxial layer, diffuse through the remaining portion of the epitaxial layer to contact the P- and N-type buried layers beneath the epitaxial layer. The ultimate configuration of these wells is depicted in FIG. 9. After removal of the nitride, the underlying stress relief oxide is removed, and a sacrificial oxidation performed (not shown).

In the sacrificial oxidation step, a layer of silicon dioxide is formed across the surface of the entire structure by heating it in an oxidizing ambient to form a layer approximately 400 Angstroms thick. The sacrificial oxidation helps to insure a very clean gate oxide. Then, a $V_T$ adjustment is performed by implanting boron across the entire structure. In the preferred embodiment, a dose of approximately 3.0 E 12 atoms/cm$^2$ at an energy of 30 kev is employed. The function of this implant is to adjust the threshold voltage of the to-be-formed field effect transistors. Finally, the sacrificial oxide is stripped from the structure using an etchant.

After removal of the sacrificial oxide, the upper surface of the structure is again oxidized, this time to form the thin gate oxide for the field effect transistors. In the preferred embodiment, the gate oxide is approximately 150 Angstroms thick. Because of the thinness of the gate oxide, it is not shown in FIG. 9. Over the upper surface of the gate oxide, a layer of polycrystalline silicon 50 is formed to provide the gates of the MOS transistors. In the preferred embodiment, polysilicon 50 is deposited using chemical vapor deposition and is approximately 3250 Angstroms thick. After deposition of the poly silicon, it is doped with a suitable impurity to render it conductive. In the preferred embodiment phosphorus is used to reduce the resistivity of layer 50 to approximately 30 ohms per square. Next, polysilicon 50 is masked and etched to define the gates as shown in FIG. 9.

Following the formation of a thin oxide layer (not shown), a mask is defined across the upper surface of the structure, for example, using photoresist. The mask protects all of the structure except for where the N-channel field effect transistor and the PNP active base region are to be formed in the P-well 39. The width of the field oxide regions 48 which surround the P-well 39 provide ample masking tolerances, thereby eliminating the need for critical alignment of this mask. Next, an ion-implantation of N-conductivity type impurity is performed to dope the lightly doped drain and source structure 49a and the base region of the PNP bipolar transistor 49b. In the preferred embodiment, this implant comprises phosphors impurity introduced with a dose of 3.0 E 13 atoms/cm$^2$ and an energy of 20 kev.

After implantation, a high temperature chemical vapor deposition spacer oxide is deposited across the entire surface of the structure. In the preferred embodiment the spacer oxide is deposited to a thickness of 1800 Angstroms, and then a reactive ion or other anisotropic etching process is performed to define the spacer regions 52 adjacent the polysilicon electrodes 50. Then, the structure is thinly oxidized with a "screen" oxide step (not shown) to inhibit dopant channeling during source/drain ion-implantation and reduce crystalline damage.

After formation of the screen oxide, an N+source-drain mask is defined to expose the P-well 39 and one portion of N-well 36a where the NPN bipolar transistor collector contact is to be formed. Next, N-type impurity, preferably arsenic, is implanted into the structure to form the N-type source and drain regions 55a as well as the collector contact 55b. The base contact region 55c of the PNP bipolar transistor may also be formed at this step.

Figure 10:
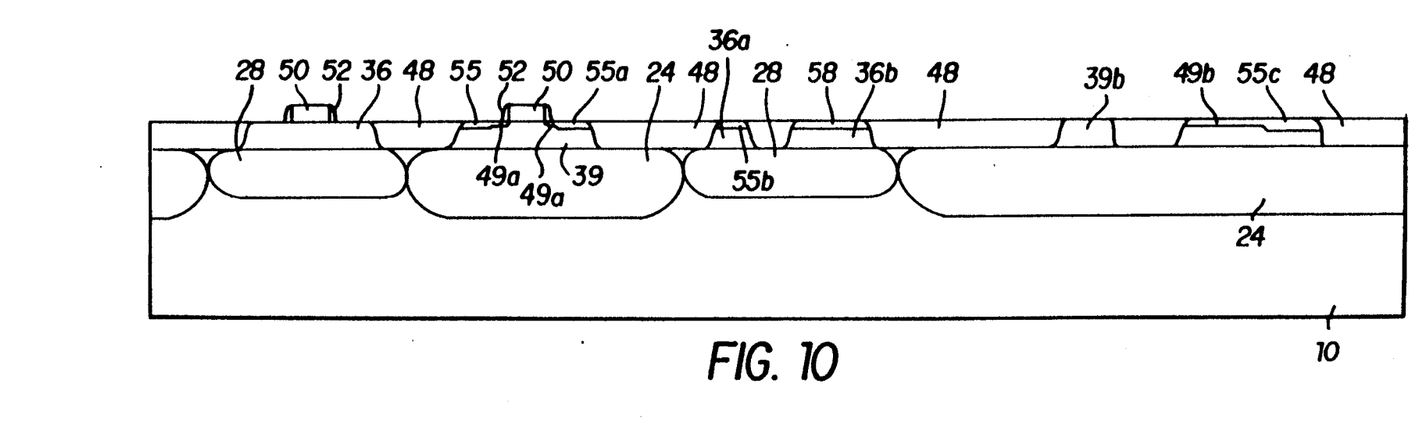
FIG. 10 is a cross-sectional view of a semiconductor structure after implantation of the bipolar base.

Then, that mask is removed and another mask (not shown) is formed across all of the structure except where N-well 36b is formed. (This is the region where the active portion of the NPN bipolar transistor will be fabricated.) P-type impurity, preferably BF$_2$+(boron difluoride), is introduced into the upper surface of N-well 36b, preferably by a dose of 4.0 E 13 atoms/cm$^2$ at an energy of 35 kev. The result is a lightly doped P-type base region 58 separated from the N-type buried layer 28 by N-well 36b. At this stage in the process, the structure appears as shown in FIG. 10.

Figure 11:
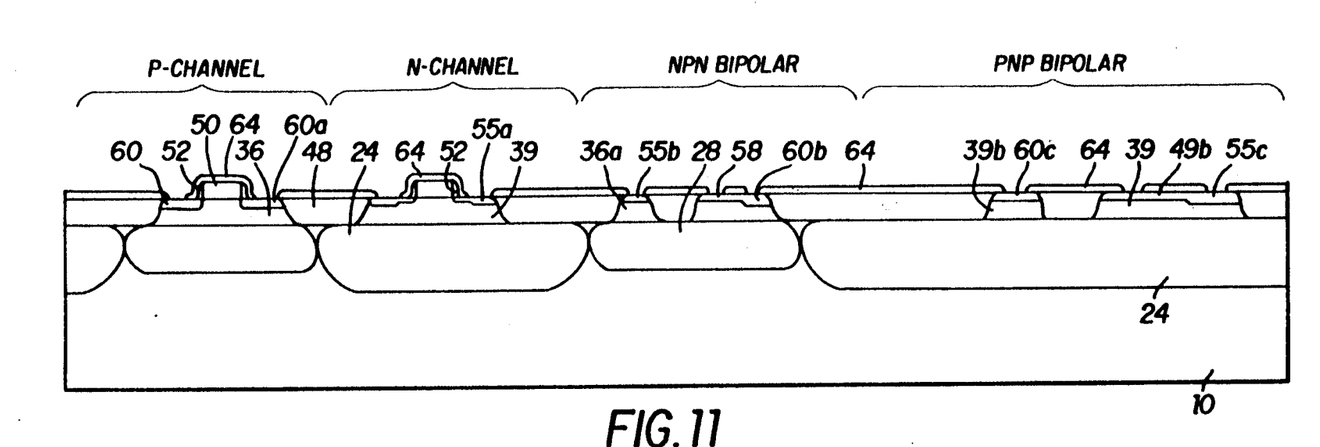
FIG. 11 is a cross-sectional view of a semiconductor structure after etching of the interpoly oxide.

After implanting the NPN base region 58, the structure again is masked with photoresist to expose only the regions of the N-wells 36 where field effect transistors are desired, to expose the portions of N-well 36b where an NPN base contact is desired, and to expose the portions of P-well 39b where a PNP bipolar collector contact will be formed. Then P-conductivity type dopants are implanted into the substrate at these locations. In the preferred embodiment, BF$_2$+ (boron difluoride) impurity is employed with a dose of 1.0 E 15 atoms/cm$^2$ at an energy level of 50 kev. The resulting P-type source-drain regions 60a are shown in FIG. 11. Also shown are the P-type NPN base contact 60b and the PNP collector contact 60c. After the implantation, a rapid thermal annealing step is performed in which the structure is heated to a temperature of 1050° C. for 10 seconds. During this step, dopant activation is achieved without significant dopant redistribution.

Next, the structure is subjected to a high temperature chemical vapor deposition step to form interpoly silicon dioxide layer 64. This interpoly oxide will electrically isolate the first layer of polysilicon, which is used in the field effect transistor gates, from overlying layers of polysilicon used to connect the sources, drains, and other components of the integrated circuit. After formation of the interpoly oxide 64, and using conventional photolithographic techniques, a contact mask is employed to define those regions on the surface of the structure where a second layer of polycrystalline silicon is to contact the substrate. In FIG. 11 openings are shown over the P-type source and drain regions 60a, the N-type source and drain regions 55a, the collector contact 55b, and the NPN base 58, 60b. A part of region 58 will become the NPN emitter, while region 60b is the contact to the NPN base. Also shown in FIG. 11 are openings to the PNP collector contact 60c and the PNP base 49b, 55c. A part of region 49b will become the PNP emitter, while region 55c is the contact to the PNP base.

After formation of the contact openings, a second layer of polycrystalline silicon is deposited across the entire surface of the structure. In the preferred embodiment, chemical vapor deposition is employed to deposit a layer approximately 2000 Angstroms thick. After deposition of the polysilicon, an ion-implantation step is done to tailor the electrical properties of subsequently-formed resistors. The entire polysilicon surface is implanted during this step, with the precise location resistor regions being defined by subsequent etching steps. Of course, the precise dose and energy levels will depend upon the desired resistance of the to-be-formed resistors; however, in the preferred embodiment, arsenic impurity is employed with a dose of 9.0 E 13 atoms/cm$^2$ at an energy level of 50 kev. The more impurity introduced into the polysilicon, the lower will be the resistance.

After implanting the resistor regions in polysilicon 66, another mask is formed to protect the resistor regions and expose those regions of the polysilicon which are to be doped strongly with N-conductivity type impurity. This doping is performed, in the preferred embodiment, with the polysilicon 66 doped with enough arsenic impurity to lower its sheet resistance to 300 ohms/square.

Figure 12:
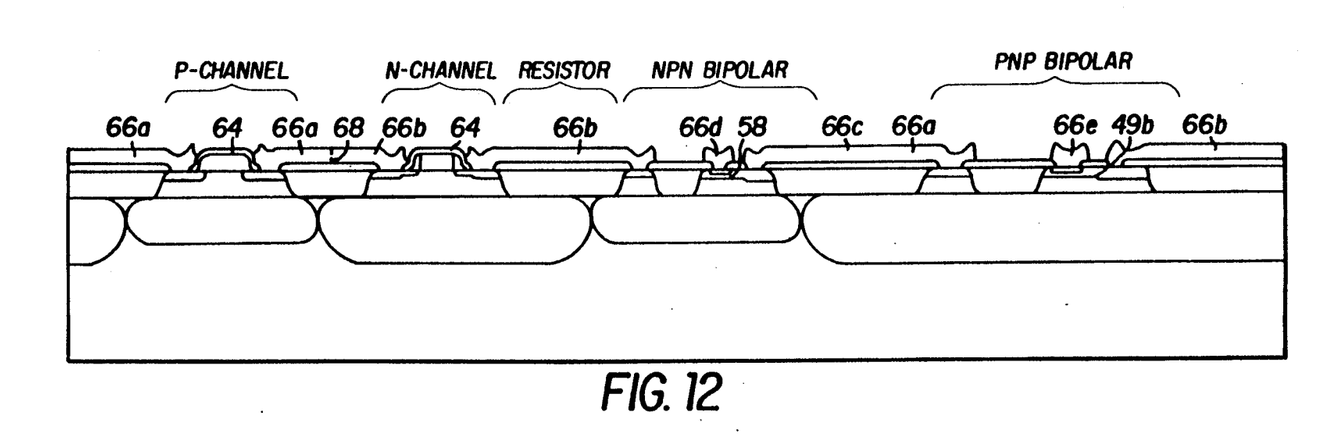
FIG. 12 is a cross-sectional view of a semiconductor structure after annealing of the second layer of polycrystalline silicon.

Next, another mask is formed over the structure to protect the resistor regions and those regions of the polysilicon which have already been doped, and to expose those regions which are to be doped strongly with P-conductivity type impurity. These regions are doped with $BF_2+$ (boron difluoride) to lower their sheet resistance to 900 ohms/square. As shown in FIG. 12, region 66a of the second layer of polycrystalline silicon has been doped strongly with P-type impurity, while region 66b has been doped with N-type impurity. The masking and doping operations may create PN junctions such as junction 68 between P- and N-type polysilicon. Any such junctions which are undesired will be "shorted" in a later process operation. In other regions of the structure 66c, the polycrystalline silicon may not be doped heavily and therefore will retain the electrical characteristics determined by the unmasked implant done immediately after polysilicon deposition. This will provide high value resistors.

Following the doping of the polysilicon, another photolithographic masking and etching step is performed. During this operation the polycrystalline silicon is removed from the surface of the integrated circuit except for where contacts, resistors, and interconnect lines are desired. After removal of the undesired polycrystalline silicon, the remaining regions are annealed by heating the structure to 900° C. for 15 minutes. During the annealing step, impurity in the polycrystalline silicon diffuses out and into the underlying structure to assure excellent contact between the second layer of polycrystalline silicon and the active regions in the epitaxial layer. Also, during this process, impurities move from the emitter contacts 66d, 66e into the base regions 58, 49b to form the emitters of the NPN and PNP bipolar devices, respectively. At this stage in the process, the appearance of the structure is shown in FIG. 12.

Figure 13:
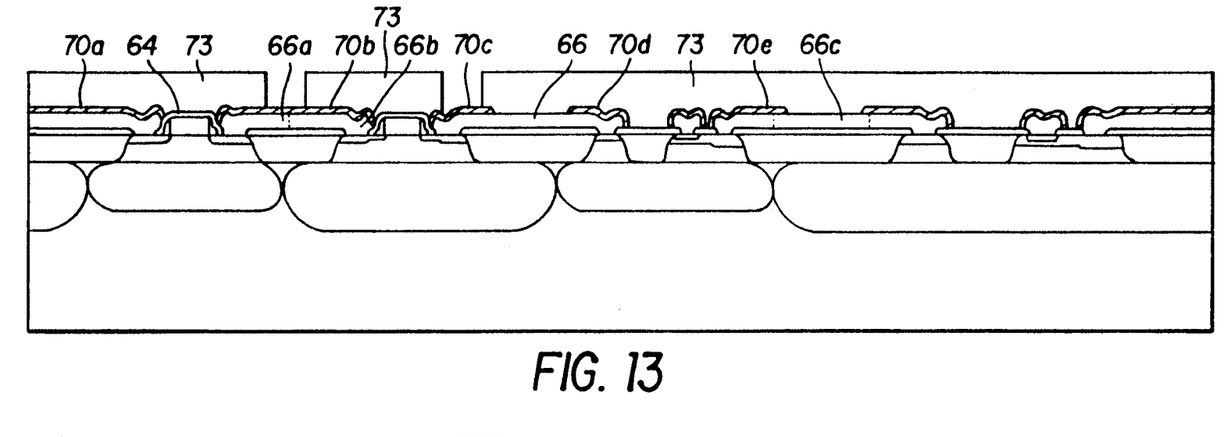
FIG. 13 is a cross-sectional view of a semiconductor structure after etching of contact openings to the metal silicide.

Next, a layer of a metal which reacts with silicon to form a silicide is sputtered across the surface of the structure. In the preferred embodiment, titanium is employed; however, other silicide-forming refractory metals such as tungsten, platinum, or cobalt are also suitable. Then, another mask is formed across the surface of the structure to expose those regions of the surface where metal silicide is not desired. The portions of the titanium layer thereby exposed then are etched using conventional process technology, for example, an etchant consisting of ammonium hydroxide and hydrogen peroxide mixture. The structure then is heated to cause the titanium to react with the underlying polycrystalline silicon to form titanium silicide. Any remaining titanium then is removed from the structure using ammonium hydroxide and hydrogen peroxide mixture. The structure is again heated to assure complete conversion of all titanium to titanium silicide. As shown in FIG. 13, the titanium silicide generally overlies the polycrystalline silicon. For example, region 70a of titanium silicide assures a low resistance contact to the P-channel FET. Silicide 70b overlying polysilicon region 66a and 66b short these two regions together, thereby providing a low resistance contact between the P-channel and the N-channel devices. Silicide regions 70c and 70d provide contacts to opposite ends of a low value resistor extending between the collector of the NPN bipolar device and the N-channel FET. Finally, silicide region 70e provides a low resistance contact to the lightly doped polycrystalline silicon 66c. This polysilicon provides a high value resistor which is useful in the formation of static memory cells.

Next, a layer 73 of phosphorus-doped glass is deposited on the structure by chemical vapor deposition. After deposition, a liquid, polymeric glass is spun onto the surface and baked to planarize layer 73. The glass is cured by a thermal process in a steam ambient. In the preferred embodiment the structure is heated to 800° C. for 30 minutes.

Following the curing, another photolithographic operation is performed to define contact openings to the titanium silicide layer beneath glass 73. The undesired glass is removed using an anisotropic plasma oxide etch, resulting in the structure depicted in FIG. 13.

Tungsten, or other suitable metal then is deposited using chemical vapor deposition onto the structure to form plugs 75 in the openings in glass 73. By controlling the deposition conditions, the tungsten is deposited only in the openings. In an alternative embodiment, a thin metal layer approximately 200 Angstroms TiW is first sputter-deposited. Then tungsten is chemical vapor deposited over the entire surface. Because of the conformal nature of the deposition, the contact holes are completely filled with tungsten metal. Following the deposition, the tungsten is anisotropically etched back using a plasma etch until no tungsten remains atop the planarized oxide. Because of the anisotropic nature of the plasma etch, plugs of metal remain in the contact holes.

Figure 14:
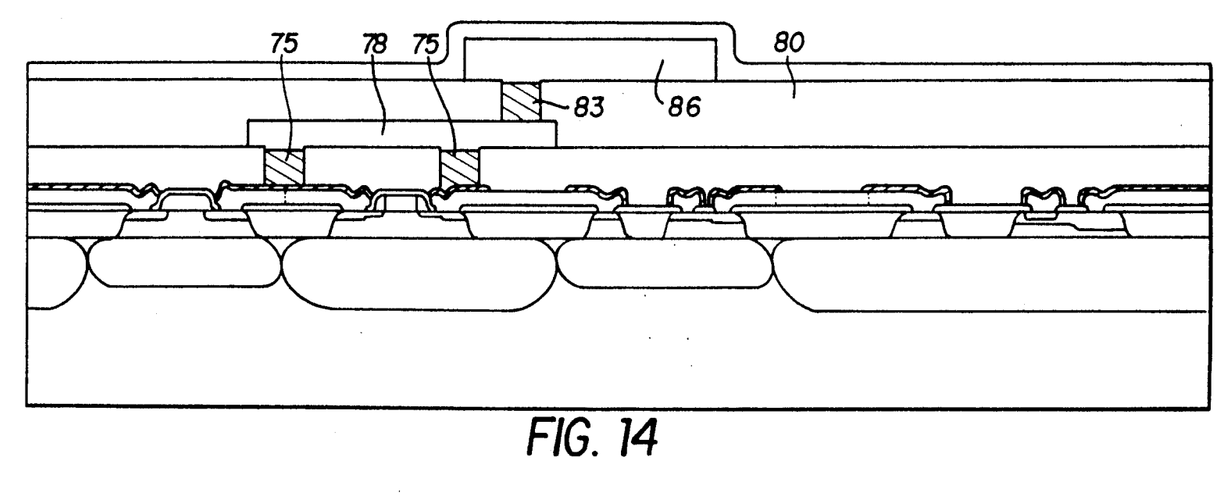
FIG. 14 is a cross-sectional view of a semiconductor structure of the completed structure.

After formation of the plugs, a first layer of metal 78, preferably aluminum/silicon/copper alloy, is sputtered across the upper surface of glass 73. Conventional photolithographic processes are used to mask and remove undesired regions of the metal as shown in FIG. 14.

Next, the layer of low temperature chemical vapor deposition oxide, is deposited across the structure. Again, a liquid polymeric glass is spun and cured to planarize the surface. Then it is etched back using a plasma oxide etch to further planarize it. Finally, another layer of low temperature oxide is deposited across its upper surface to form the final intermetal oxide which electrically isolates the first metal layer from a second metal layer. Using conventional photolithographic techniques, the oxide layer 80 is masked and etched to define openings where contacts to the metal layer are desired. Tungsten is deposited in these openings in the same manner as described above to form plugs, such as plug 83, wherever contacts to the first layer of metal are desired.

Next, a second layer of metal 86 is deposited across the upper surface of oxide layer 80 in contact with plugs 83. In the preferred embodiment, this layer of metal comprises aluminum/copper alloy. Again, a photolithographic masking and etching step is performed to define the metal into desired regions and interconnect selected regions of the metal. After definition of metal 86, the structure is passivated using conventional techniques.

The process of our invention as described above provides significant advantages over prior art BiCMOS processes. The technique by which the field oxide regions are formed increases the density of the integrated circuit by providing a highly planar surface with essentially zero encroachment. The collector-substrate capacitance of the NPN bipolar transistor is reduced by reducing the collector area and separating the N-type buried collector contact from nearby P-type buried layers.

The process is also advantageous in that improved field effect transistors are formed which are more resistant to punchthrough than an prior art BiCMOS processes. The use of vertical contact openings in glass overlying the metal contact layer enables tungsten plugs to be formed in a manner which increases packing density over conventional processes.

In the foregoing description, specific times, temperatures, thicknesses, and the like, have been described to enable a more complete understanding of the invention. It should be appreciated, however, that these details were provided to illustrate the process, not to limit it. The scope of the invention may be ascertained from the appended claims.

We claim:

1. A method of making a pair of complementary bipolar transistors and a pair of complementary field effect transistors comprising:
   forming first and second buried layers in a semiconductor substrate of a first conductivity type, each of the buried layers being formed adjacent an upper surface of the substrate, and each being of specified conductivity type;
   depositing a layer of epitaxial silicon across the upper surface of the substrate over each of the buried layers;
   later depositing a first layer of polycrystalline silicon on the epitaxial silicon to form at least one gate of a first field effect transistor and at least one gate of a second field effect transistor which is a complementary transistor of the first field effect transistor;
   in a single step, introducing a second conductivity-type impurity of conductivity type opposite to the first conductivity type into the active base region of a first bipolar transistor and the lightly doped drain and source regions of the second field effect transistor;
   in another single step, introducing a second conductivity-type impurity into the base contact region of the first bipolar transistor, the collector contact region of a second bipolar transistor which is a complementary transistor of the first bipolar transistor and the source and drain regions of the second field effect transistor;
   introducing a second conductivity-type impurity into the active base region of the second bipolar transistor;
   in another single step, introducing a first conductivity-type impurity into the collector contact region of the first bipolar transistor, the base contact region of the second bipolar transistor and the source and drain regions of the first field effect transistor;
   depositing a second layer of polycrystalline silicon across the upper surface of the bipolar transistors and the field effect transistors to form the emitter contacts of the bipolar transistors;
   doping the emitter contacts of the bipolar transistors; and
   diffusing impurities from the respective emitter contact of the bipolar transistors into the corresponding base regions of the bipolar transistors to form the respective emitter regions of the bipolar transistors.

2. A method as in claim 1 wherein the step of forming first and second buried layers comprises:
   defining a mask across the surface of the substrate to expose only regions of the substrate where a first conductivity-type impurity is desired, each of such regions having a periphery;
   introducing a first conductivity-type impurity into the exposed regions of the substrate;
   removing portions of the mask adjacent the periphery of the regions doped with first conductivity-type impurity to thereby expose additional regions of the substrate;
   forming a layer of masking material over all exposed portions of the substrate;
   removing the mask;
   introducing a second conductivity-type impurity into the substrate except where it is overlaid by the layer of masking material; and
   removing the masking material.

3. A method as in claim 1 wherein:
   the step of defining a mask comprises forming regions of silicon nitride separated from the semiconductor substrate by regions of silicon dioxide; and
   the step of removing portions of the mask comprises laterally etching the silicon dioxide from beneath the silicon nitride at a periphery of the silicon nitride.

4. A method as in claim 3 wherein the step of forming a layer of masking material comprises oxidizing the substrate.

5. A method as in claim 4 wherein the step of removing the mask comprises etching the silicon nitride regions.

6. A method as in claim 5 wherein the step of introducing a first conductivity-type impurity into the exposed regions of the substrate comprises ion-implanting the first conductivity-type impurity.

7. A method as in claim 2 wherein the complementary conductivity-type buried layers are spaced apart in the substrate.

8. A method as in claim 2 wherein the step of depositing a layer of epitaxial silicon is followed by a step comprising:
   masking the epitaxial layer to define regions thereof to be doped with first conductivity-type impurity, which regions correspond to the regions of the substrate containing first conductivity-type impurity.

9. A method as in claim 8 wherein the regions of the epitaxial silicon to be doped with first conductivity-type impurity correspond to the regions of the substrate doped with first conductivity-type impurity.

10. A method as in claim 9 followed by a step comprising masking and doping the epitaxial layer with second conductivity-type impurity in regions to correspond with corresponding regions of the substrate.

11. A method as in claim 10 followed by the step of anisotropically etching the epitaxial layer to define locations where field isolation is desired.

12. A method as in claim 11 followed by a step comprising forming regions of spacer material on sides of the regions of epitaxial silicon implanted with first and second conductivity-type impurity.

13. A method as in claim 12 followed by a step comprising oxidizing exposed portions of the epitaxial silicon to form field isolation regions.

* * * * *